(12) United States Patent
Lu et al.

(10) Patent No.: US 10,297,935 B2
(45) Date of Patent: May 21, 2019

(54) POWER SUPPLY AND CIRCUIT BOARD OUTPUT STRUCTURE THEREOF

(71) Applicant: 3Y POWER TECHNOLOGY (TAIWAN), INC., Taoyuan (TW)

(72) Inventors: Shao-Feng Lu, Taoyuan (TW); Chuan-Kai Wang, Taoyuan (TW)

(73) Assignee: 3Y POWER TECHNOLOGY (TAIWAN), INC., Taoyuan (TW)

( * ) Notice: Subject to any disclaimer, the term of this patent is extended or adjusted under 35 U.S.C. 154(b) by 0 days.

(21) Appl. No.: 15/953,503

(22) Filed: Apr. 16, 2018

(65) Prior Publication Data

US 2018/0337473 A1 Nov. 22, 2018

(30) Foreign Application Priority Data

May 17, 2017 (CN) ...................... 2017 2 0549798 U

(51) Int. Cl.
*H01R 12/51* (2011.01)
*H01R 12/52* (2011.01)
*H05K 1/18* (2006.01)
*H05K 1/02* (2006.01)
*H01R 12/53* (2011.01)

(52) U.S. Cl.
CPC .......... *H01R 12/515* (2013.01); *H01R 12/53* (2013.01); *H05K 1/0271* (2013.01); *H05K 1/181* (2013.01); *H05K 2201/1031* (2013.01); *H05K 2201/10287* (2013.01); *H05K 2201/10303* (2013.01); *H05K 2201/10356* (2013.01)

(58) Field of Classification Search
CPC .... H01R 12/515; H01R 12/52; H01R 12/523; H01R 12/526; H01R 12/53; H05K 2201/10287; H05K 2201/1031; H05K 2201/10325; H05K 2201/10333
See application file for complete search history.

(56) References Cited

U.S. PATENT DOCUMENTS

| 2011/0226517 A1* | 9/2011 | Lu | ...................... H05K 1/0263 174/261 |
| 2016/0240948 A1* | 8/2016 | Li | ......................... H01R 12/53 |

* cited by examiner

*Primary Examiner* — Hoa C Nguyen
(74) *Attorney, Agent, or Firm* — JCIPRNET

(57) ABSTRACT

The invention discloses a circuit board output structure, which includes a power output section disposed on a circuit board and at least one metal connection stand electrically connected to the power output section. Each metal connection stand includes a first connection piece showing an included angle with respect to the circuit board. A plurality of connection holes for electrically connecting output wires are formed on the first connection piece. When it is required to change an output specification, the replacement can be more simple and convenient since the metal connection stand may be directly replaced without replacing the whole circuit board. Because the first connection piece has the included angle specified with respect to the circuit board, R angle and stress of the inserted output wires may be reduced to prevent the output wires from damage, detaching from the circuit board or having poor electrical contact after the assembly.

18 Claims, 5 Drawing Sheets

POWER SUPPLY AND CIRCUIT BOARD OUTPUT STRUCTURE THEREOF

CROSS-REFERENCE TO RELATED APPLICATION

This application claims the priority benefit of China application serial no. 201720549798.4, filed on May 17, 2017. The entirety of the above-mentioned patent application is hereby incorporated by reference herein and made a part of this specification.

BACKGROUND OF THE INVENTION

1. Field of the Invention

The invention relates to the technical field of power supply, and more particularly, to a power supply and a circuit board output structure thereof.

2. Description of Related Art

As shown by FIG. 1, in order to provide a plurality of output voltages, a power supply is generally provided with holes 111' formed on a circuit board 110' for inserting and soldering wires 130'. However, when it is required to change an output specification of the power supply, the holes 111' and the wires 130' on the circuit board 110' can no longer be used. The circuit board 110' and the wires 130' need to be replaced by new ones and a layout of the circuit board 110' need to be redesigned (reopening desired holes). Also, other electronic components on the circuit board 110' need to be removed for re-soldering, and thus the replacement can be complicated.

In addition, after being disposed on the new circuit board 110', the wires 130' need to be soldered so the wires 130' can be electrically connected to the circuit board 110'. However, due to limitations by the space inside the power supply and design of an output terminal thereof, the wires 130' can only be connected to the output terminal of the power supply after being bent at an angle. Consequently, R angle and stress of the wires 130' are increased, making the output wire 130' prone to damage, or detaching from the circuit board 110' or having poor electrical contact.

Therefore, it is necessary to provide a circuit board output structure capable of reducing R angle and stress of the wires and avoiding assembly problems without replacing the whole circuit board, so as to solve aforesaid problems existing in the prior art.

SUMMARY OF THE INVENTION

The invention aims to provide a circuit board output structure capable of reducing R angle and stress of the wires and avoiding assembly problems without replacing the whole circuit board.

Another goal of the invention is to provide a power supply, which can reduce R angle and stress of the wires and avoid assembly problems without replacing the whole circuit board when the output specification needs to be changed.

To realize these goals, the technical solution of the invention is to provide a circuit board output structure, which includes a power output section disposed on a circuit board and at least one metal connection stand electrically connected to the power output section. Each of the metal connection stand includes a first connection piece showing an included angle with respect to the circuit board, and a plurality of connection holes for electrically connecting output wires are formed on the first connection piece.

Preferably, the included angle between the first connection piece and the circuit board is less than 90°.

Preferably, the included angle between the first connection piece and the circuit board is between 45° and 60°.

Preferably, each of the at least one metal connection stand further includes a second connection piece connected to the first connection piece and showing an included angle with respect to the first connection piece, and end portions of the first connection piece and the second connection piece are electrically connected to the power output section.

Preferably, the included angle between the second connection piece and the circuit board is less than or equal to 90°.

Preferably, a soldering leg is protrudingly provided on each of the end portions of the first connection piece and the second connection piece, soldering holes are formed on the power output section, and the soldering legs are correspondingly inserted to the soldering holes and soldered to the power output section.

Preferably, a fastening hole is disposed on each of the end portions of the first connection piece and the second connection piece, and the metal connection stand is electrically connected to the power output section by a fastening member inserted to the fastening hole.

Preferably, an installing hole corresponding to the fastening hole is formed on the power output section, and the fastening member is connected to the installing hole.

Preferably, the end portion of the first connection piece is bent to form a first connection portion, the end portion of the second connection piece is bent to form a second connection portion, and the fastening hole is formed on each of the first connection portion and the second connection portion.

Preferably, the metal connection stand is formed by bending a rigid metal.

Correspondingly, the invention further provides a power supply, which includes an input portion, a circuit board and a circuit board output structure, which are disposed inside the power supply. The input portion is configured to obtain an input power. The circuit board is electrically connected to the input portion to convert the input power into a plurality of output powers having different voltage levels. The circuit board output structure is as described above. The output wires are configured to output the plurality of output powers having the different voltage levels.

Compared with the prior art, in the circuit board output structure of the invention, each metal connection stand includes the first connection piece showing the included angle with respect to the circuit board, and the connection holes for electrically connecting the output wires are formed on the first connection piece. Accordingly, when it is required to change the output specification of the power supply, the replacement can be more simple and convenient since the metal connection stand may be directly replaced, and quantity and aperture of the connection holes on the first connection piece may be adjusted without replacing the whole circuit board. In addition, because the first connection piece has the included angle specified with respect to the circuit board, R angle and stress of the output wires inserted on the first connection piece may be reduced, so as to prevent the output wires from damage, or prevent the output wires from detaching from the circuit board or having poor electrical contact after the assembly. Compared with the prior art, larger area can be provided for inserting more of the output wires while still occupying the same area of the circuit board. The first connecting piece is separated from the circuit board by a distance so effective dissipation can be provided when large current is to be transmitted. Correspondingly, the power supply having said circuit board output structure can also provide the same technical effects of the above.

DESCRIPTION OF THE EMBODIMENTS

Figure 1:
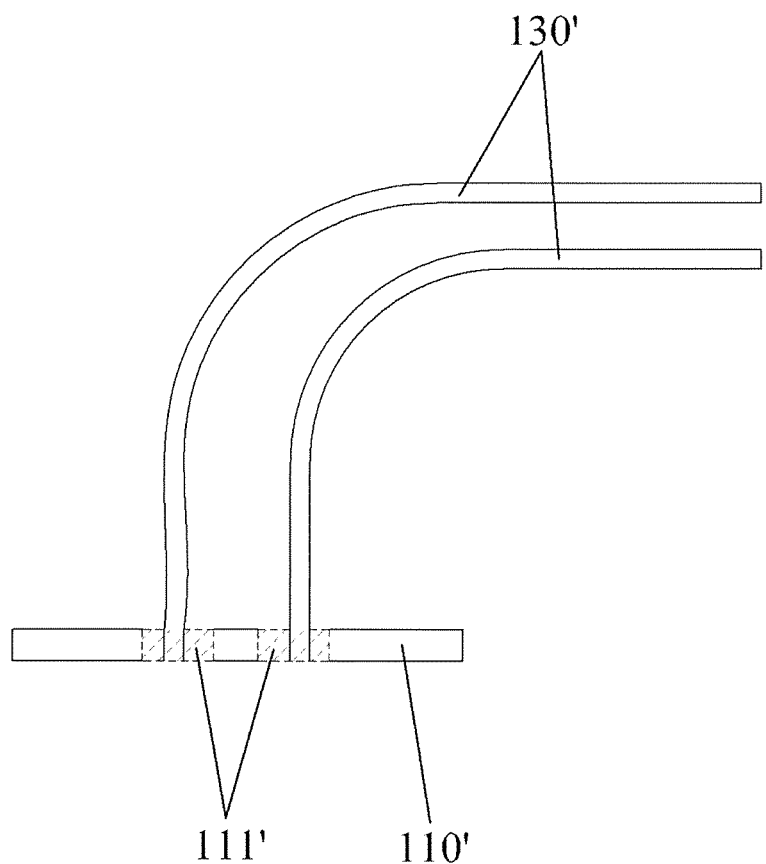
FIG. 1 is a schematic drawing of the conventional circuit board output structure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
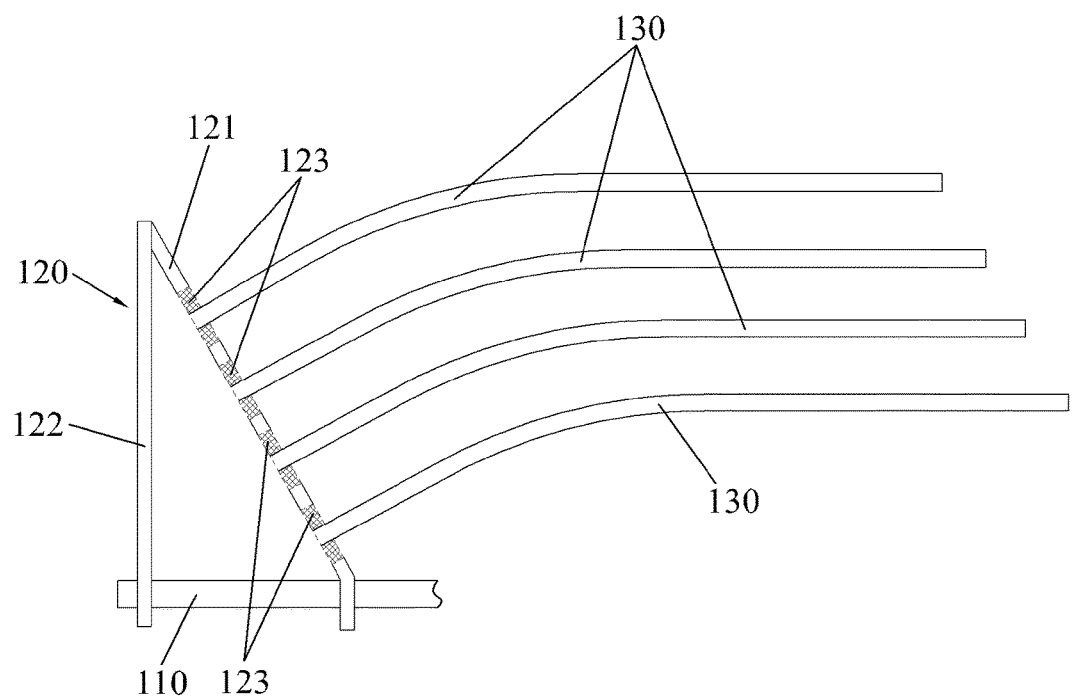
FIG. 2 is a schematic drawing of a circuit board output structure according to the invention.

As shown by FIG. 2, a circuit board output structure 100 provided by the invention includes a power output section 110 disposed on a circuit board and at least one metal connection stand 120 electrically connected to the power output section 110. Each of the metal connection stand 120 may be provided to connect at least one output wire 130 of a corresponding specification.

Specifically, each of the metal connection stand 120 includes a first connection piece 121 and a second connection piece 122, which are connected to each other and have an included angle. Each of end portions of the first connection piece 121 and the second connection piece 122 is electrically connected to the power output section 110, and an included angle between the first connection piece 121 and the circuit board is less than 90°. An included angle between the second connection piece 122 and the circuit board is less than or equal to 90°. At least one connection hole 123 is formed on the first connection piece 121. One output wire 130 is correspondingly inserted and electrically connected to one connection hole 123.

Preferably, the included angle between the first connection piece 121 and the circuit board is between 45° and 60°, but not limited thereto.

Figure 3:
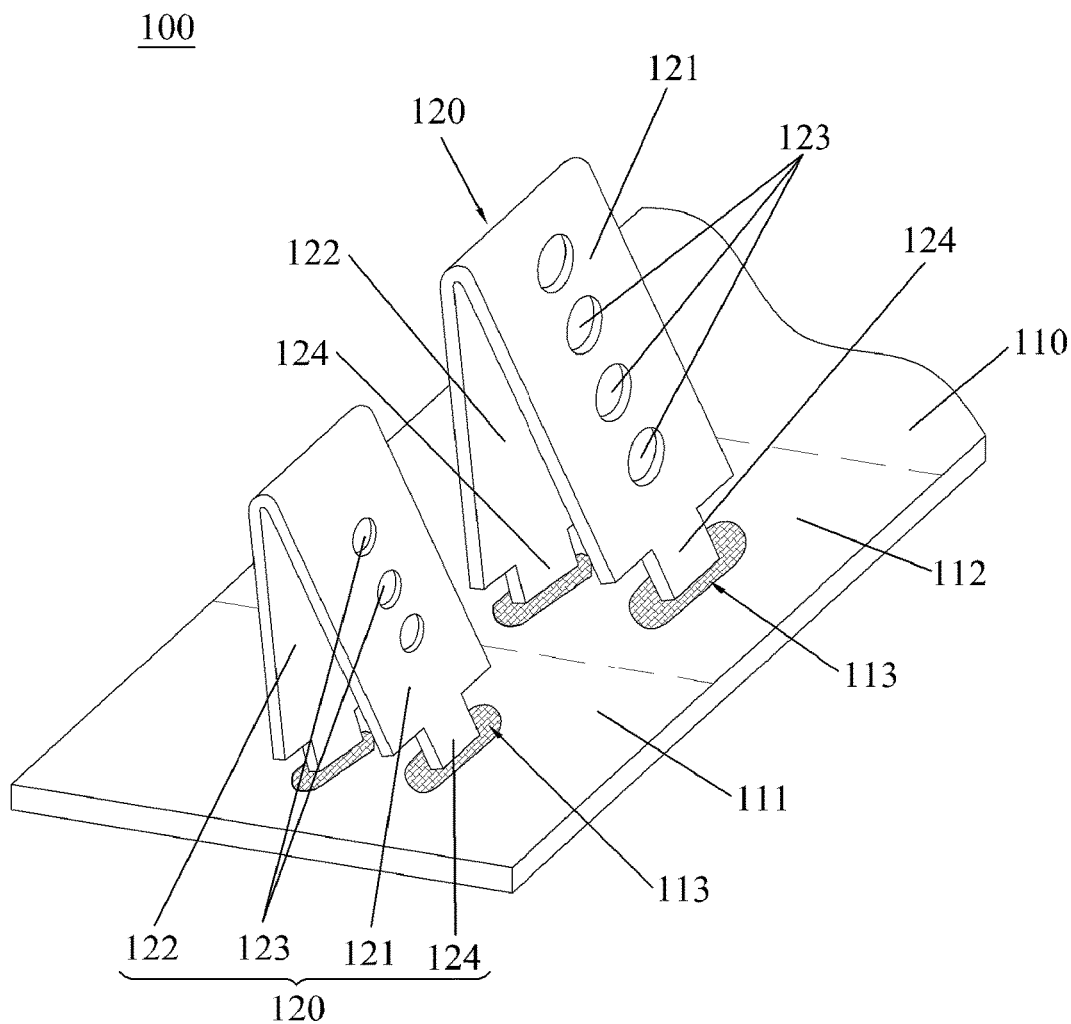
FIG. 3 is a schematic structural view of a metal connection stand according to an embodiment of the invention.

Referring to FIGS. 2 and 3 together, in the invention, the metal connection stands 120 with different specifications may be disposed based on different output specifications, and quantity and aperture of the connection holes 123 on the metal connection stand 120 may also be different in response to various specifications. Correspondingly, at least one level section may be separated from the power output section 110 of the circuit board. Each level section is electrically connected to the metal connection stand 120 of one specification, and the at least one output wire 130 of the corresponding specification is inserted to the connection hole 123 of the metal connection stand 120 so the different metal connection stands 120 can output different voltages. In the embodiment shown by FIG. 3, the power output section 110 is divided into a first level section 111 and a second level section 112 for providing different voltages. The metal connection stands 120 of the different specifications are connected to the first level section 111 and the second level section 112, respectively, and the two metal connection stands 120 output different voltages. When it is required to change the output specification of the power supply, the replacement can be more simple and convenient since the metal connection stands 120 of the different specification may be directly selected in the replacement without replacing the whole circuit board.

Naturally, it is also possible that the metal connection stands 120 of the same specification may be connected to each of the level sections in order to output the same voltage. For example, the metal connection stands 120 of the same specification may be connected to each of the first level section 111 and the second level section 112 such that the two outputted voltages are identical.

Referring to FIGS. 2 and 3, in an embodiment of the circuit board output structure 100 of the invention, a soldering leg 124 is protrudingly provided on each of the end portions of the first connection piece 121 and the second connection piece 122 of the metal connection stand 120. Corresponding soldering holes 113 are formed on the power output section 110. The soldering leg 124 is correspondingly inserted to the soldering hole 113 for soldering, so as to electrically connect the metal connection stand 120 to the power output section 110. The included angle between the first connection piece 121 and the circuit board is between 45° and 60°. The second connection piece 122 is perpendicular to the circuit board. The output wire 130 of the corresponding specification is inserted to the connection hole 123 on the first connection piece 121. Further, the output wires 130 of the different specification may be inserted to the different metal connection stands 120 to output the different voltages (e.g., to output voltages of 12V, 5V, 3V, etc.).

Figure 4:
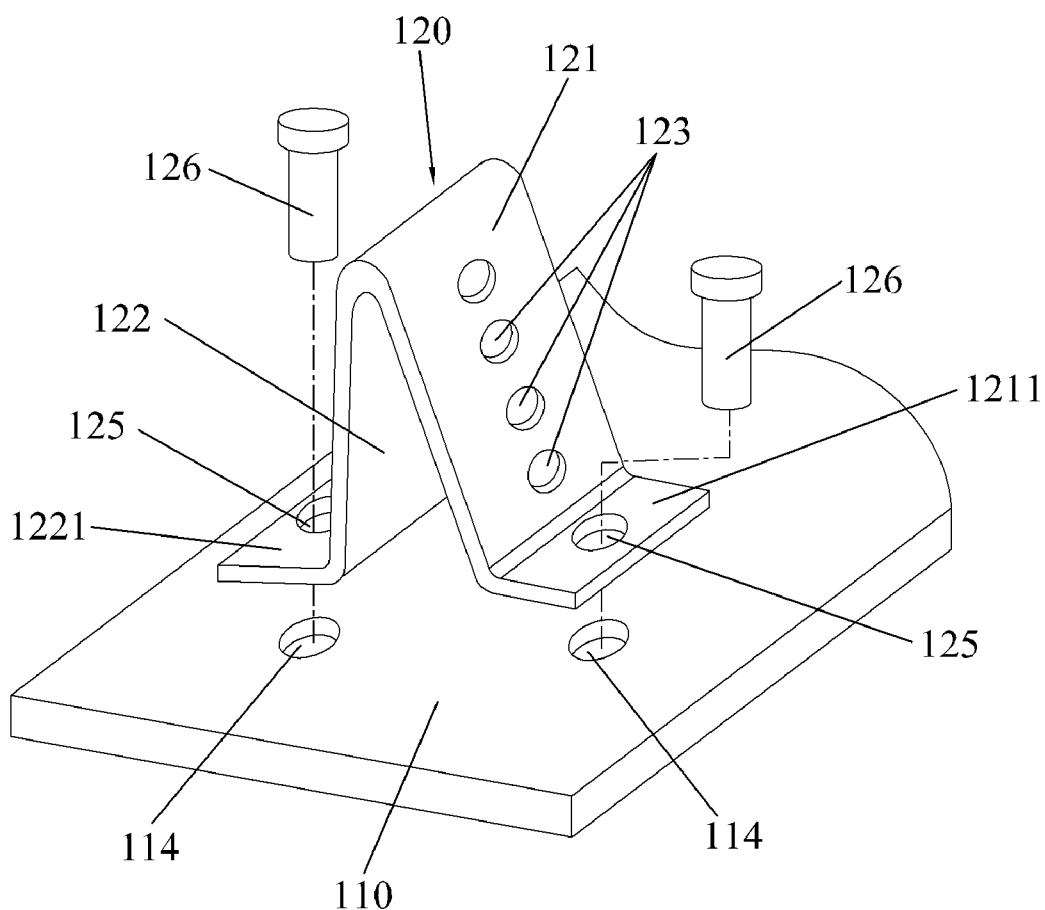
FIG. 4 is a schematic structural view of a metal connection stand according to another embodiment of the invention.

The following description refers to FIGS. 2 and 4, in another embodiment of the circuit board output structure 100 of the invention, the metal connection stand 120 is electrically connected to the power output section 110 through a fastening member 126 formed by a conductive material. Specifically, the end portion of the first connection piece 121 is bent to form a first connection portion 1211, the end portion of the second connection piece 122 is bent to form a second connection portion 1221, and a fastening hole 125 is formed on each of the first connection 1211 and the second connection portion 1221 which respectively protrude in opposite directions. An installing hole 114 corresponding to the fastening hole 125 is formed on the power output section 110. The metal connection stand 120 is electrically connected to the power output section 110 by the fastening member 126 inserted to the fastening hole 125 and the installing hole 114. Further, the included angle between the first connection piece 121 and the circuit board is between 45 and 60°, and the included angle between the second connection piece 122 and the circuit board is less 90°.

Preferably, the fastening member 126 may be a screw, but not limited thereto. The other fastening members may also be used for connecting the metal connection stand 120.

Certainly, the metal connection stand 120 of the invention is not limited only to be electrically connected to the power output section 110 by the two methods described above, but may also be connected to the power output section 110 by ways of forcing in or plugging in.

In the invention, the metal connection stand 120 is formed by bending a rigid metal material (e.g., a cooper track) in one piece.

Figure 5:
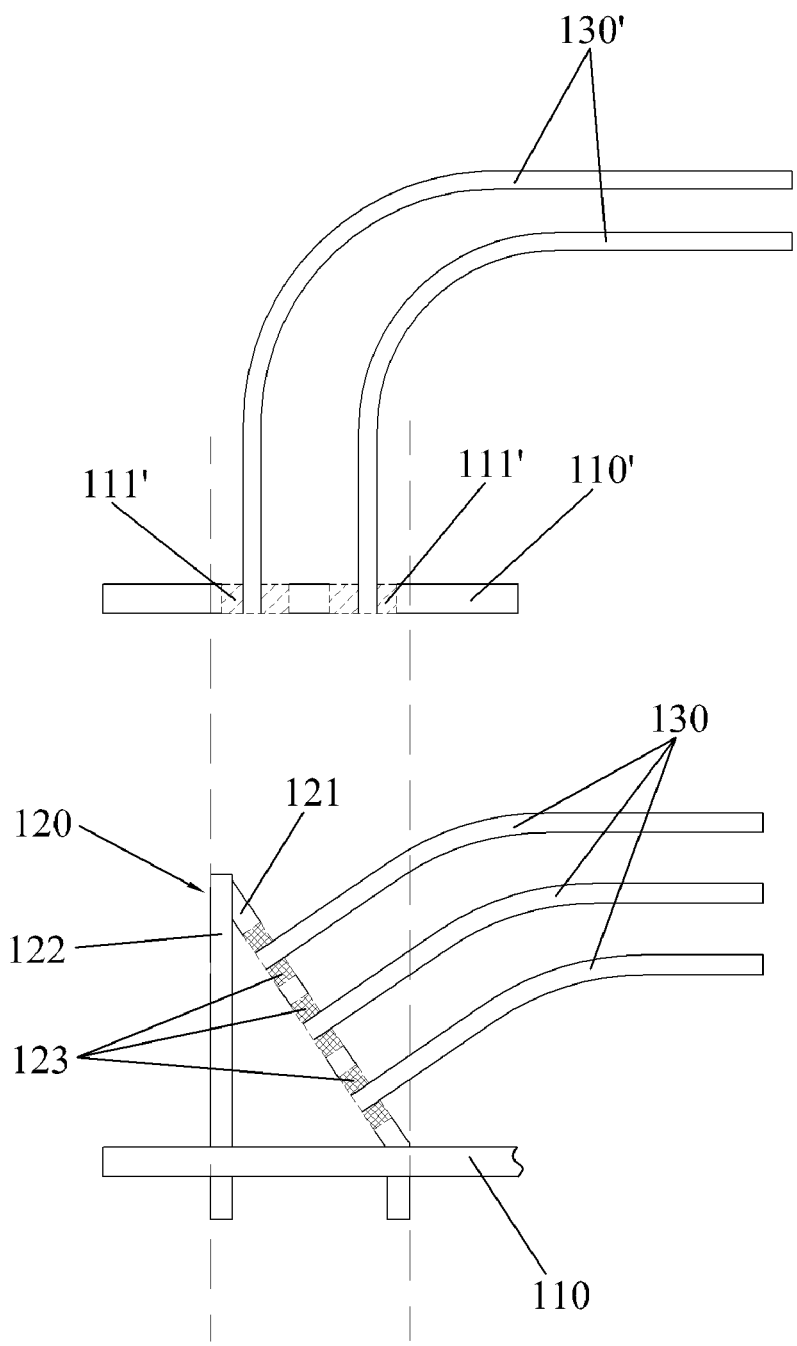
FIG. 5 is a schematic drawing illustrating comparison between the circuit board output structure of the invention and the conventional output structure.

The following description refers to FIG. 5, in view of the circuit board output structure 100 of the invention, it is given that the included angle between the first connection piece 121 of the metal connection stand 120 and the circuit board is less than 90°. Therefore, on the premise of occupying the same space on the circuit board, the metal connection stand 120 of the invention can provide larger area for inserting more of the output wires 130 so the number of the output wires 130 usable can become higher, as shown by FIG. 5. While occupying the same area on the circuit board, the conventional method of directly connecting the output wires 130' to the circuit board 110' can only connect two output wires 130', whereas the method of the invention can have three output wires 130 inserted to the metal connection stand 120 without occupying unnecessary space in the power supply. Further, the included angle between the first connection piece 121 and the circuit board being less than 90° can reduce R angle and stress of the inserted output wires 130, so as to prevent the output wires 130 from damage, or prevent the output wires 130 from detaching from the circuit board or having poor electrical contact after the assembly. Furthermore, with larger area provided by the metal connection stand 120 and the first connection piece 121 separated from the circuit board by a specific distance, effective dissipation can be provided when large current is to be transmitted. Moreover, when it is required to change the output specification of the power supply, given that the metal connection stand 120 is modularized, the replacement can be more simple and convenient since the metal connection stand 120 of the different specification may be directly replaced without replacing the whole circuit board.

In addition, the invention further provides a power supply including an input portion disposed inside the power supply, a circuit board and the circuit board output structure 100. The input portion is configured to obtain an input power. The circuit board is electrically connected to the input portion to convert the input power into a plurality of output powers having different voltage levels. The circuit board output structure 100 includes a power output section 110 disposed on the circuit board and at least one metal connection stand 120 electrically connected to the power output section 110. Each of the metal connection stand 120 may be provided to connect at least one output wire 130 of a corresponding specification. The output wires 130 are configured to output the plurality of output powers having the different voltage levels. Among them, detailed structure of the circuit board output structure 100 has been described in the foregoing embodiments, which are not repeated hereinafter.

In summary, in the circuit board output structure 100 of the invention, each of the metal connection stand 120 includes the first connection piece 121 showing the included angle with respect to the circuit board, and the connection holes 123 for electrically connecting the output wires 130 are formed on the first connection piece 121. Accordingly, when it is required to change the output specification of the power supply, the replacement can be more simple and convenient since the metal connection stand 120 may be directly replaced, and quantity and aperture of the connection holes 123 on the first connection piece 121 may be adjusted without replacing the whole circuit board. In addition, because first connection piece 121 has the included angle specified with respect to the circuit board, R angle and stress of the output wires 130 inserted to the first connection piece 121 may be reduced, so as to prevent the output wires from damage, or prevent the output wires 130 from detaching from the circuit board or having poor electrical contact after the assembly. Compared with the prior art, larger area can be provided for inserting more of the output wires 130 while still occupying the same area of the circuit board. The first connecting piece 121 is separated from the circuit board by a distance so effective dissipation can be provided when large current is to be transmitted. Correspondingly, the power supply of the invention can also provide the same technical effects described above.

The embodiments described are chosen and described in order to best explain the principles of the invention and its best mode practical application. It is not intended to be exhaustive to limit the invention to the precise form or to the exemplary embodiments disclosed. Namely, persons skilled in the art are enabled to understand the invention through various embodiments with various modifications as are suited to the particular use or implementation contemplated. It is intended that the scope of the invention be defined by the claims appended hereto and their equivalents in which all terms are meant in their broadest reasonable sense unless otherwise indicated.

What is claimed is:

1. A circuit board output structure, comprising:
   a power output section disposed on a circuit board;
   at least one metal connection stand electrically connected to the power output section, each of the metal connection stand comprising a first connection piece showing a first included angle with respect to the circuit board, a second connection piece connected to the first connection piece and showing a second included angle with respect to the first connection piece, and end portions of the first connection piece and the second connection piece are electrically connected to the power output section, a plurality of connection holes for electrically connecting output wires being formed on the first connection piece to reduce stress of the output wires electrically connected to the connection holes.

2. The circuit board output structure according to claim 1, wherein the first included angle between the first connection piece and the circuit board is less than 90°.

3. The circuit board output structure according to claim 2, wherein the first included angle between the first connection piece and the circuit board is between 45° and 60°.

4. The circuit board output structure according to claim 1, wherein a third included angle between the second connection piece and the circuit board is less than or equal to 90°.

5. The circuit board output structure according to claim 1, wherein a soldering leg is protrudingly provided on each of the end portions of the first connection piece and the second connection piece, soldering holes are formed on the power output section, and the soldering legs are correspondingly inserted to the soldering holes and soldered to the power output section.

6. The circuit board output structure according to claim 1, wherein a fastening hole is disposed on each of the end portions of the first connection piece and the second connection piece, and the metal connection stand is electrically connected to the power output section by a fastening member inserted to the fastening hole.

7. The circuit board output structure according to claim 6, wherein an installing hole corresponding to the fastening hole is formed on the power output section, and the fastening member is connected to the installing hole.

8. The circuit board output structure according to claim 6, wherein the end portion of the first connection piece is bent to form a first connection portion, the end portion of the second connection piece is bent to form a second connection portion, and the fastening hole is formed on each of the first connection portion and the second connection portion.

9. The circuit board output structure according to claim 1, wherein the metal connection stand is formed by bending a rigid metal.

10. A power supply, comprising:
   an input portion disposed inside the power supply, the input portion being configured to obtain an input power;
   a circuit board, being electrically connected to the input portion to convert the input power into a plurality of output powers having different voltage levels; and
   a circuit board output structure, comprising:
      a power output section disposed on the circuit board; and
      at least one metal connection stand electrically connected to the power output section, each of the metal connection stand comprising a first connection piece showing a first included angle with respect to the circuit board, a second connection piece connected to the first connection piece and showing a second included angle with respect to the first connection piece, and end portions of the first connection piece and the second connection piece are electrically connected to the power output section, a plurality of connection holes for electrically connecting output wires being formed on the first connection piece to reduce stress of the output wires electrically connected to the connection holes, and the output wires being configured to output the plurality of output powers having the different voltage levels.

11. The power supply according to claim 10, wherein the first included angle between the first connection piece and the circuit board is less than 90°.

12. The power supply according to claim 11, wherein the first included angle between the first connection piece and the circuit board is between 45° and 60°.

13. The power supply according to claim 10, wherein a third included angle between the second connection piece and the circuit board is less than or equal to 90°.

14. The power supply according to claim 10, wherein a soldering leg is protrudingly provided on each of the end portions of the first connection piece and the second connection piece, soldering holes are formed on the power output section, and the soldering legs are correspondingly inserted to the soldering holes and soldered to the power output section.

15. The power supply according to claim 10, wherein a fastening hole is disposed on each of the end portions of the first connection piece and the second connection piece, and the metal connection stand is electrically connected to the power output section by a fastening member inserted to the fastening hole.

16. The power supply according to claim 15, wherein an installing hole corresponding to the fastening hole is formed on the power output section, and the fastening member is connected to the installing hole.

17. The power supply according to claim 15, wherein the end portion of the first connection piece is bent to form a first connection portion, the end portion of the second connection piece is bent to form a second connection portion, and the fastening hole is formed on each of the first connection portion and the second connection portion.

18. The power supply according to claim 10, wherein the metal connection stand is formed by bending a rigid metal.

* * * * *